United States Patent [19]

Lin

[11] Patent Number: 5,864,464
[45] Date of Patent: Jan. 26, 1999

[54] HEAT SINK FOR INTEGRATED CIRCUIT

[76] Inventor: Alex Lin, 3F., No. 3, Lane 38, Sec. 4, Chong Hsin Road, Wu Gu Hsiang, Taipei Hsien, Taiwan

[21] Appl. No.: 871,303

[22] Filed: Jun. 9, 1997

[51] Int. Cl.[6] .................................................. H05K 7/20
[52] U.S. Cl. ...................... 361/697; 165/86.3; 165/122; 165/185; 174/16.3; 257/713; 257/719
[58] Field of Search .................................. 165/80.2, 80.3, 165/121, 122, 125, 185; 174/16.3; 257/707, 713, 718, 719, 722; 361/697, 704, 707, 709–710

[56] References Cited

U.S. PATENT DOCUMENTS

| | | | |
|---|---|---|---|
| 5,208,731 | 5/1993 | Blomquist | 361/709 |
| 5,335,722 | 8/1994 | Wu | 361/697 |
| 5,486,981 | 1/1996 | Blomquist | 361/710 |
| 5,570,271 | 10/1996 | Lavochkin | 361/764 |
| 5,594,623 | 1/1997 | Schwegler | 361/697 |

Primary Examiner—Gregroy D. Thompson

[57] ABSTRACT

A heat sink includes a plate for engaging on an integrated circuit device and having a number of fins. A fastener blade is engaged in the fins and includes two hooks for engaging with the device and for securing the plate to the device without threading fasteners. The fastener blade has a middle protrusion engaged with the plate for resiliently forcing the plate to engage with the device. A cover is secured to the fins for forming an air passage between the plate and the cover and a fan is secured to the cover for drawing air through the gaps formed between the fins.

6 Claims, 5 Drawing Sheets

HEAT SINK FOR INTEGRATED CIRCUIT

BACKGROUND OF THE INVENTION

1. Field of the Invention

The present invention relates to a heat sink, and more particularly to a heat sink for an integrated circuit.

2. Description of the Prior Art

Typical heat sinks include a fan device for securing to and for cooling an integrated circuit. Various kinds of heat sinks have been developed and are required to be secured to the integrated circuit with screw fastening or threading devices. However, when securing the heat sink to the integrated circuit by the threading devices, the user may not precisely determine the threaded engagement of the threading device; i.e., the threading device may be over threaded or may not be tightly threaded into place, such that the user may not really know whether the elements have been tightly assembled together or not. In addition, the user may not know whether the elements have been damaged due to over threading or not.

The present invention has arisen to mitigate and/or obviate the afore-described disadvantages of the conventional heat sinks.

SUMMARY OF THE INVENTION

The primary objective of the present invention is to provide a heat sink for an integrated circuit in which the elements may be assembled without threading fasteners.

The other objective of the present invention is to provide a heat sink for an integrated circuit in which an air passage is formed for facilitating the cooling effect of the heat sink.

In accordance with one aspect of the invention, there is provided a heat sink for an integrated circuit device, the heat sink comprises a plate for engaging on the integrated circuit device, the plate including a plurality of fins extended upward, the fins including a middle portion having a lateral channel, and a fastener blade engaged in the lateral channel and including two ends each having a first hook for engaging with the integrated circuit device and for securing the plate to the integrated circuit device without threading fasteners, the fastener blade including a middle portion having a protrusion extended downward for engaging with the plate and for resiliently forcing the plate to engage with the integrated circuit device.

The fastener blade has a handle for disengaging the hooks from the integrated circuit device. The plate includes a front portion and a rear portion each having a shoulder, the lateral channel includes two ends communicating with the shoulders for forming two notches in the ends of the lateral channel and for engaging with the first hooks of the fastener blade.

The fins includes a front most fin and a rear most fin each having a second hook, the heat sink further includes a cover, the cover includes a front portion and a rear portion each having a third hook for engaging with the second hooks and for securing the cover to the fins and for forming an air passage between the plate and the cover, the cover includes a middle portion having an orifice, the heat sink further includes a fan secured to the cover and aligned with the orifice for drawing air through the air passage. The cover includes a projection for engaging with the fins and for positioning the cover to the fins.

Two or more fastener blades may be engaged in the lateral channels and each includes two end hooks for securing the plate to the integrated circuit device without threading fasteners. The fastener blades each includes a middle protrusion for resiliently forcing the plate to engage with the integrated circuit device. A bridge member is secured between the fastener blades.

Further objectives and advantages of the present invention will become apparent from a careful reading of a detailed description provided hereinbelow, with appropriate reference to accompanying drawings.

DETAILED DESCRIPTION OF THE PREFERRED EMBODIMENT

Figure 1:
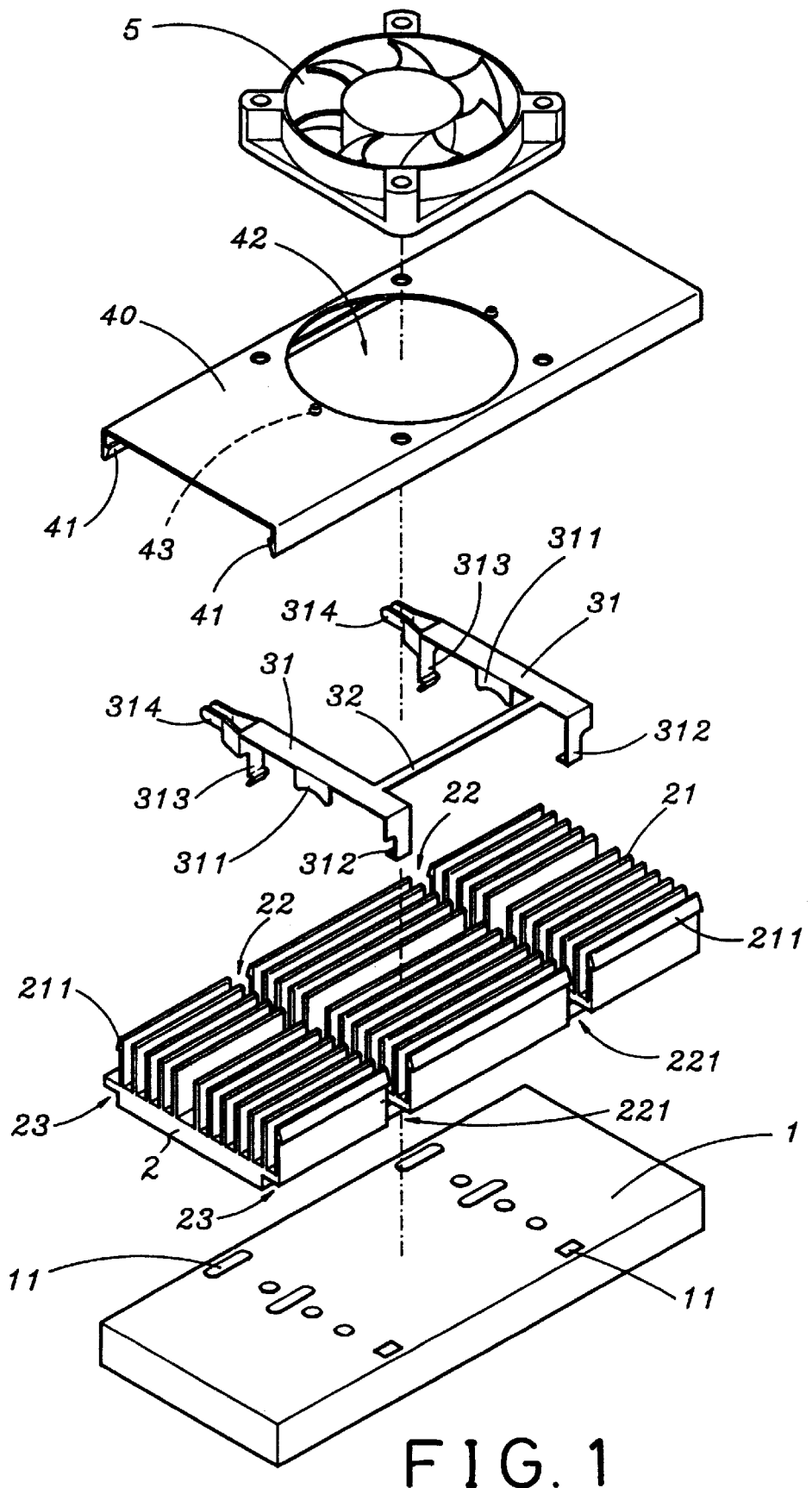
FIG. 1 is an exploded view of a heat sink in accordance with the present invention.
Figure 2:
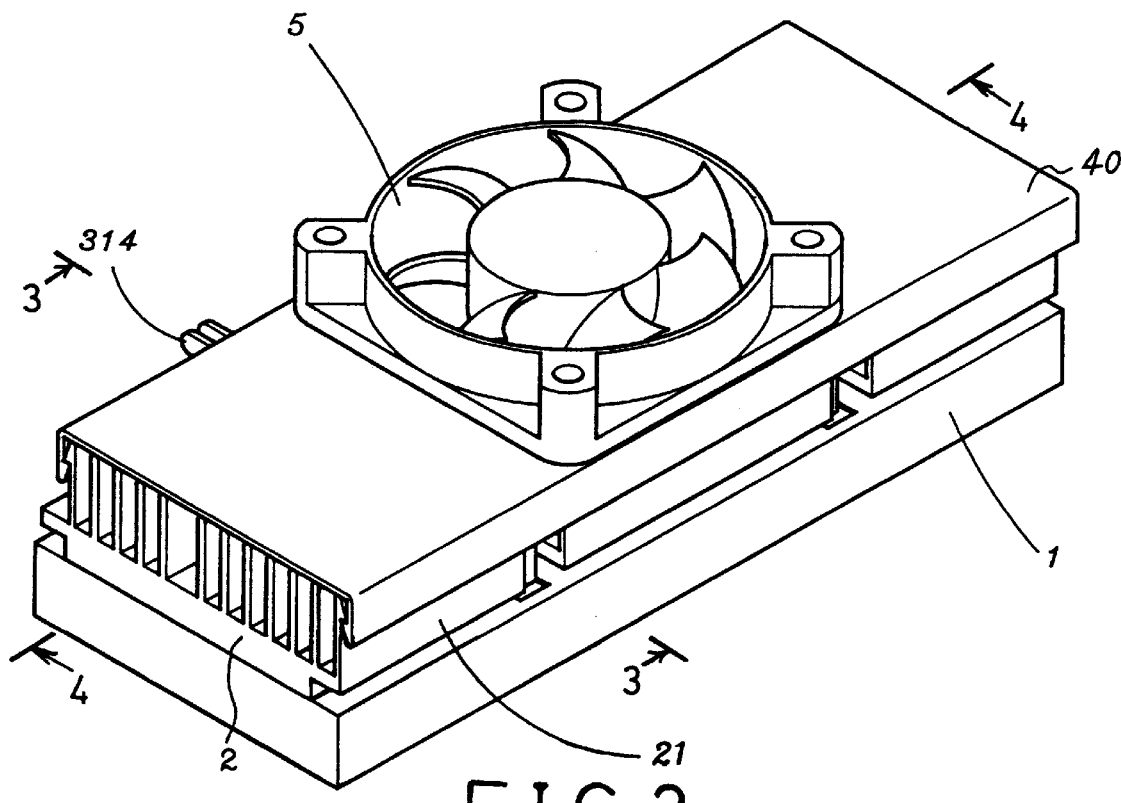
FIG. 2 is a perspective view of the heat sink.
Figure 3:
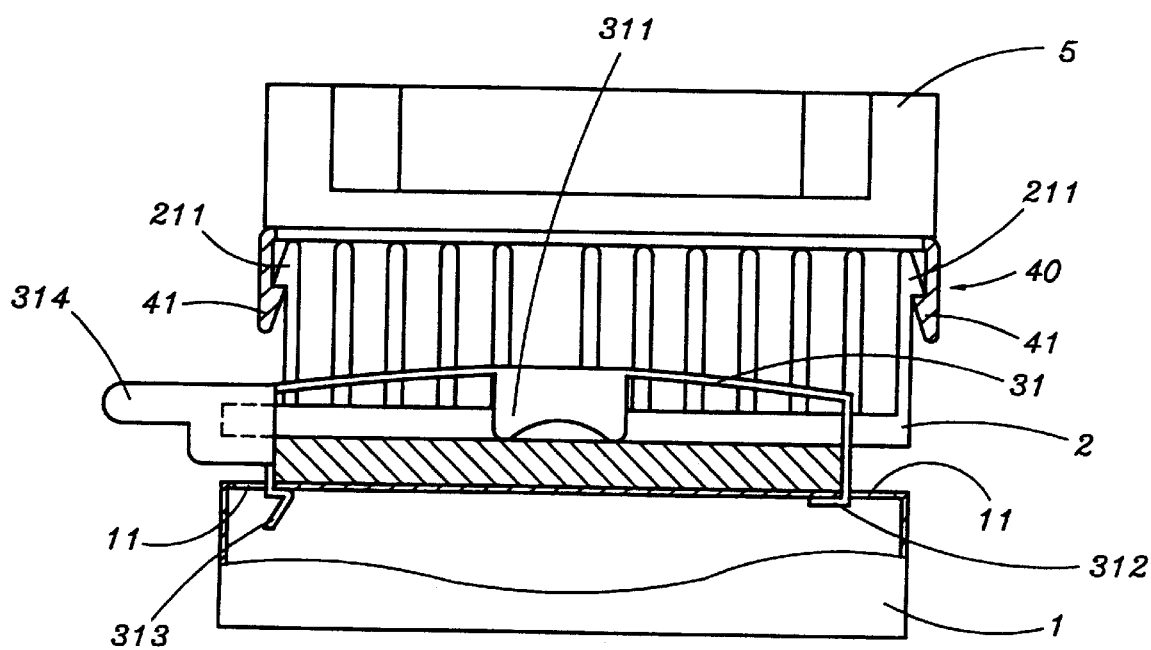
FIG. 3 is a cross sectional view taken along lines 3—3 of FIG. 2.
Figure 4:
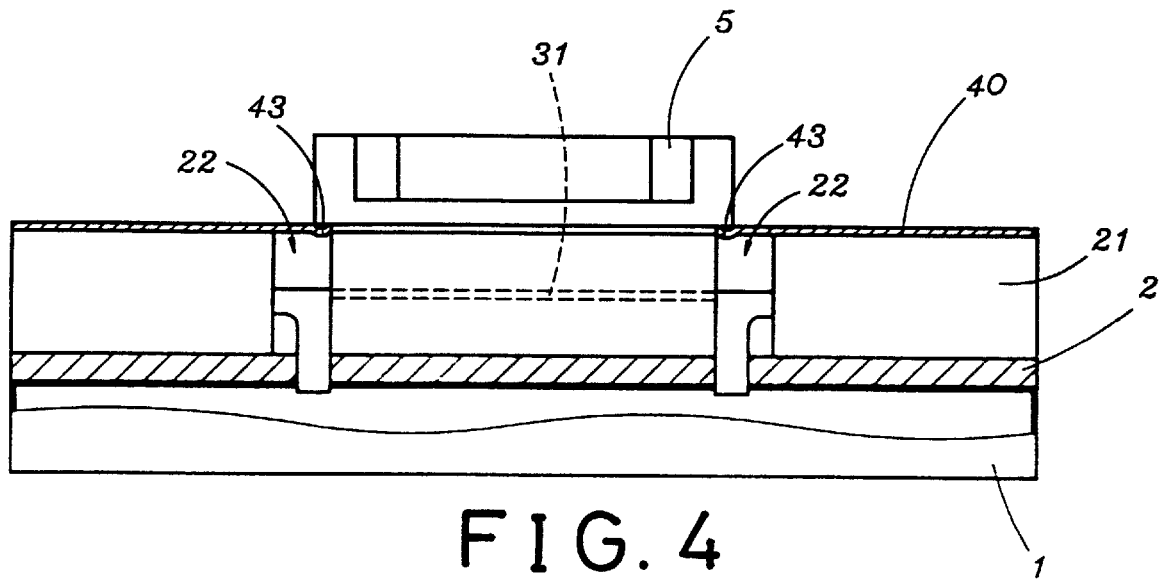
FIG. 4 is a cross sectional view taken along lines 4—4 of FIG. 2.

Referring to the drawings, and initially to FIGS. 1–4, a heat sink in accordance with the present invention comprises a solid state device 1, such as an integrated circuit or a microprocessor which normally includes a gate array. The structure of the integrated circuit is not related to the invention and will not be described in further details. The device 1 includes a number of apertures 11. A plate 2 includes a number of fins 21 extended upward for heat exchanging purposes and includes two hooks 211 formed on the outer portions of the front most fin 21 and the rear most fin 21. The fins 21 includes two spaced channels 22 laterally formed in the middle portion. The plate 2 preferably includes two shoulders 23 formed in the bottom of the front portion and the rear portion and communicating with the channels 22 and for forming a notch 221 in each of the ends of the channels 22.

Figure 5:
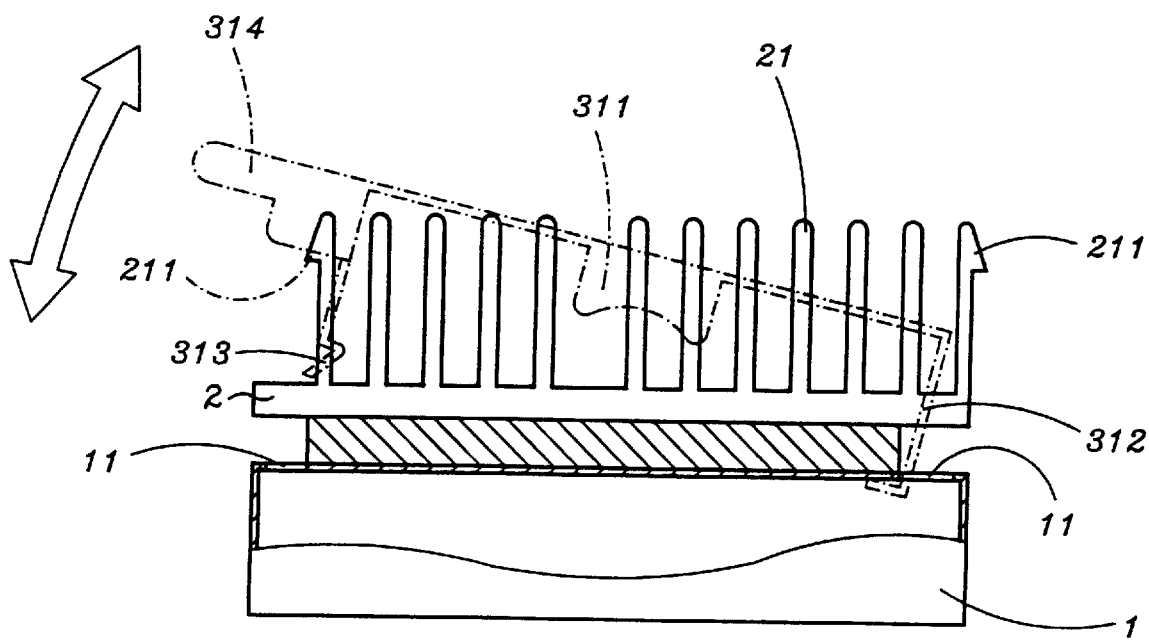
FIG. 5 is a cross sectional view similar to FIG. 3, illustrating the operation of the heat sink.

Two fastener blades 31 are engaged in the channels 22 and each includes two ends having hooks 312, 313 for engaging through the notches 221 and the apertures 11 and for securing the plate 2 to the device 1 without threading fasteners. Without the apertures 11, the hooks 312, 313 may directly engage with the edge of the device 1 for securing the plate 2 to the device 1. The fastener blades 31 each includes a protrusion 311 extended downward from the middle portion for engaging with the plate 2 and for resiliently forcing the plate 2 to the device 1, such that the plate 2 may be forced to closely engage with the device 1 for allowing the heat of the device 1 to be easily transferred to the plate 2. The size of the protrusions 311 may be predetermined such that the resilient force of the blades 31 to the plate 2 may be predetermined and such that the plate will not be damaged by over threading operation. The fastener blades 31 each includes a handle 314 formed on one end for disengaging the hook 313 from the device 1 (FIG. 5). A bridge 32 may be provided between the blades 31 for securing the blades 31 together. The bridge 32 may be engaged in the gap formed between the fins 21.

A cover 40 includes two hooks 41 dependent downward from the front portion and the rear portion for engaging with the hooks 211 of the fins 21 and for allowing the cover 40 to be easily secured to the fins 21 without threading fasteners. The cover 40 includes one or more projections 43 extended downward for engaging in the channels 22 and for engaging with the fins 21 (FIG. 4) and for positioning the cover 40 to the fins 2 such that the cover 40 may be prevented from moving relative to the fins 21. The cover 40 includes an orifice 42 formed in the middle portion. A fan 5 is secured to the cover 40 and aligned with the orifice 42 for drawing the air past the fins 21 and for cooling the fins 21 and thus for cooling the device 1.

It is to be noted that the fan 5 may be solidly secured to the cover 40 by screws, rivets or similar fasteners. However, the fan 5 and the cover 40 are assembled in the factory and are not required to be assembled by the user. The engagement of the cover 40 to the fins 21 forms an air passage between the plate 2 and the cover 40. The fins 21 are thus be engaged in the air passage such that air may be effectively drawing through the gaps formed between the fins 21 by the fan 5 and such that the fins 21 may be effectively cooled down.

Figure 6:
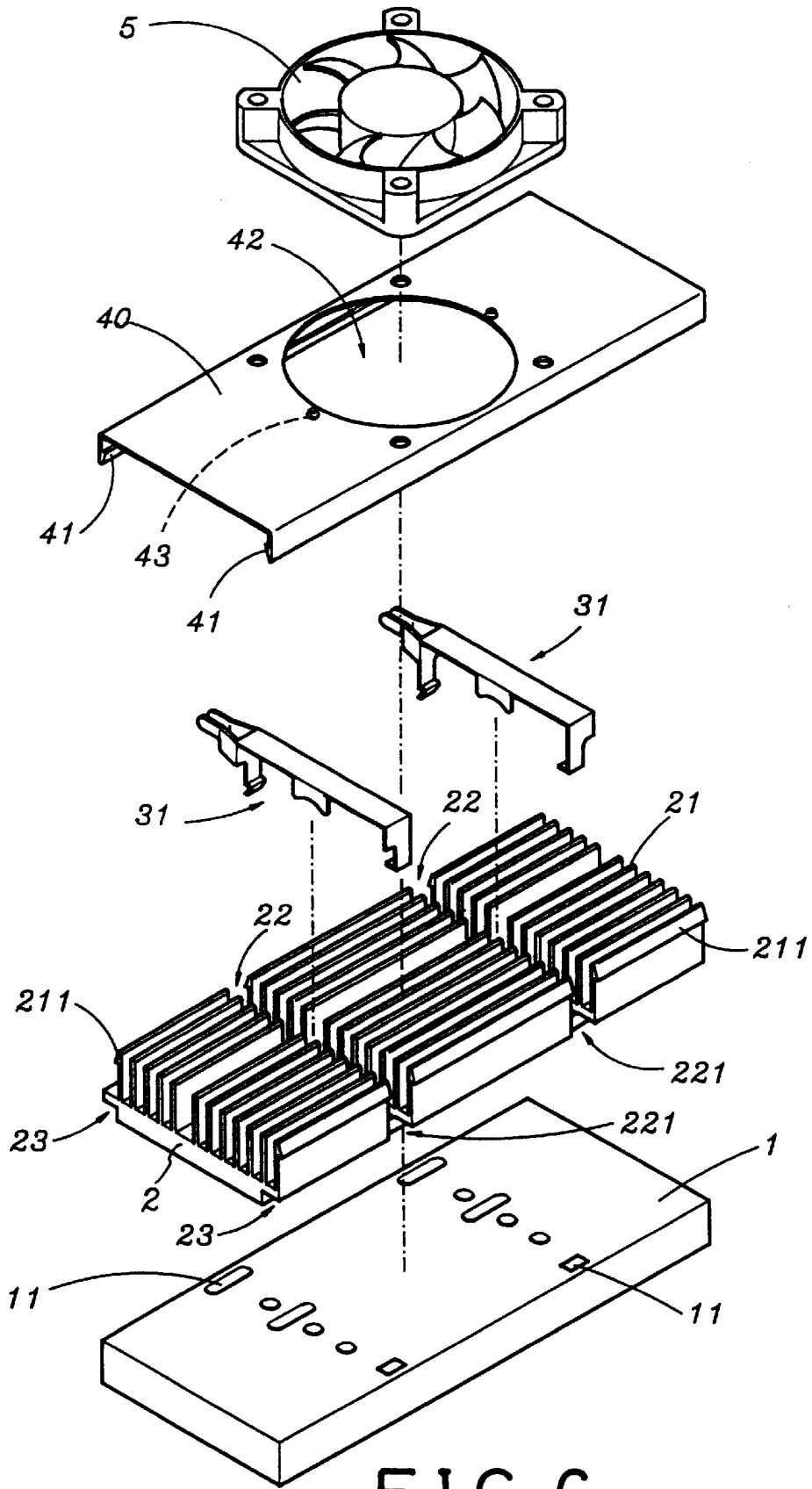
FIG. 6 is an exploded view similar to FIG. 1 illustrating another application of the heat sink.

Referring next to FIG. 6, without the bridge 32, the blade 31 may also be used to resiliently secure the plate 2 to the device.

Figure 7:
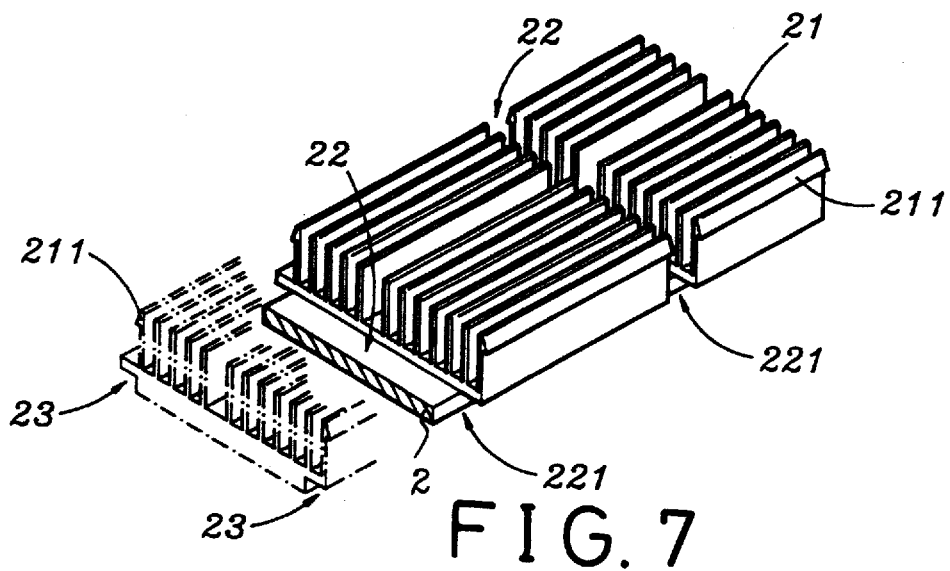
FIGS. 7, 8, 9 are partial perspective views illustrating the applications of the heat sink.
Figure 8:
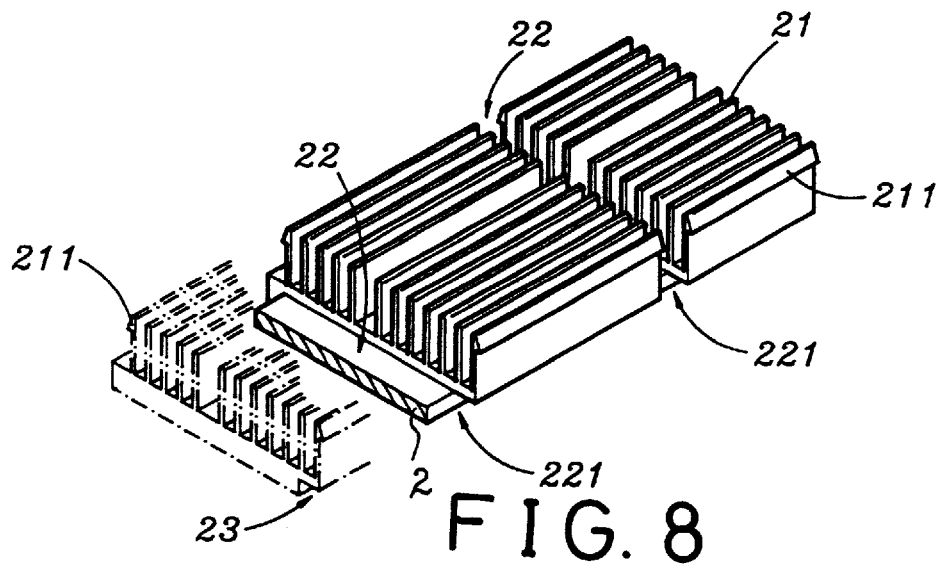
Figure 9:
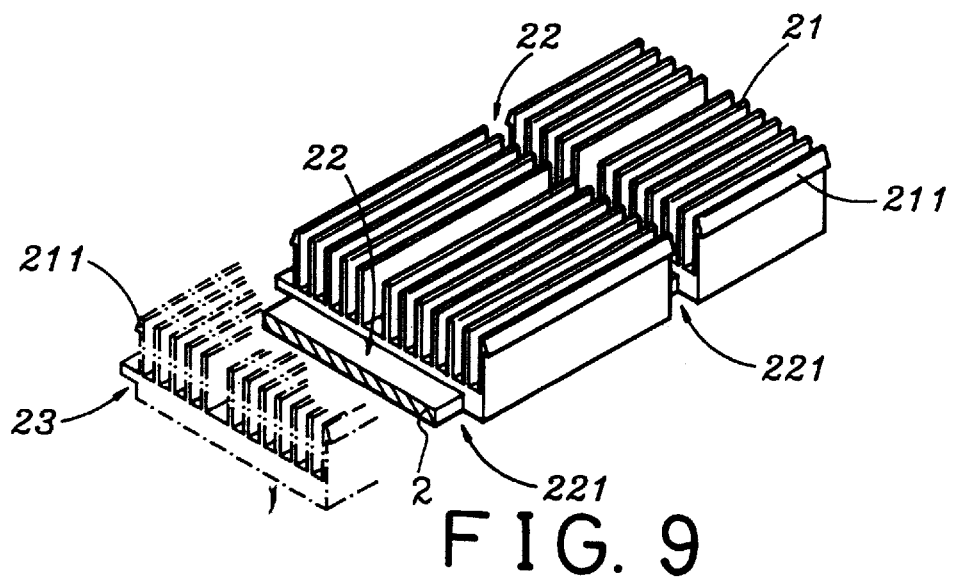

Referring next to FIG. 7, the notches 221 may be easily formed when the two shoulders 23 are formed in the bottom of the plate 2. As shown in FIGS. 8 and 9, when only one of the shoulders 23 is formed in the bottom of the plate 2, the plate 2 should be machined for forming the notches 221 where no shoulder 23 is provided.

Accordingly, the heat sink in accordance with the present invention may be easily assembled without threading fasteners. The heat sink further includes a cover for forming an air passage and for facilitating the cooling effect of the heat sink.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

I claim:

1. A heat sink for an integrated circuit device, said heat sink comprising:

a plate for engaging on the integrated circuit device, said plate including a plurality of fins extended upward, said fins including a middle portion having at least one lateral channel, said plate including a front portion and a rear portion each having a shoulder, and at least one fastener blade engaged in said at least one lateral channel and including two ends each having a first hook for engaging with the integrated circuit device and for securing said plate to said integrated circuit device without threading fasteners, said at least one fastener blade including a middle portion having a protrusion extended downward for engaging with said plate and for resiliently forcing said plate to engage with the integrated circuit device, said at least one lateral channel including two ends communicating with said shoulders for forming two notches in said ends of said at least one lateral channel and for receiving said first hooks of said at least one fastener blade.

2. A heat sink according to claim 1, wherein said at least one fastener blade includes a first end having a handle for disengaging said first hooks from said integrated circuit device.

3. A heat sink for an integrated circuit device, said heat sink comprising:

a plate for engaging on the integrated circuit device, said plate including a plurality of fins extended upward, said fins including a middle portion having at least one lateral channel, said fins including a front most fin and a rear most fin each having a second hook, at least one fastener blade engaged in said at least one lateral channel and including two ends each having a first hook for engaging with the integrated circuit device and for securing said plate to said integrated circuit device without threading fasteners, said at least one fastener blade including a middle portion having a protrusion extended downward for engaging with said plate and for resiliently forcing said plate to engage with the integrated circuit device, and a cover including a front portion and a rear portion each having a third hook for engaging with said second hooks and for securing said cover to said fins and for forming an air passage between said plate and said cover, said cover including a middle portion having an orifice, said heat sink further including a fan secured to said cover and aligned with said orifice for drawing air through said air passage.

4. A heat sink according to claim 3, wherein said cover includes at least one projection for engaging with said fins and for positioning said cover to said fins.

5. A heat sink for an integrated circuit device, said heat sink comprising:

a plate for engaging on the integrated circuit device, said plate including a plurality of fins extended upward and including a front portion and a rear portion each having a shoulder, said fins including a front most fin and a rear most fin each having a first hook, said fins including a middle portion having at least one lateral channel, said at least one lateral channel including two ends communicating with said shoulders for forming two notches in said ends of said at least one lateral channel, means for securing said plate to the integrated circuit device, said securing means including at least one fastener blade engaged in said at least one lateral channel and including two ends each having a first hook engaged through said notches for engaging with the integrated circuit device and for securing said plate to said integrated circuit device without threading fasteners, a cover including a front portion and a rear portion each having a second hook for engaging with said first hooks and for securing said cover to said fins and for forming an air passage between said plate and said cover, said cover including a middle portion having an orifice, and a fan secured to said cover and aligned with said orifice for drawing air through said air passage.

6. A heat sink according to claim 5, wherein said cover includes at least one projection for engaging with said fins and for positioning said cover to said fins.

* * * * *